(12) United States Patent
Huang et al.

(10) Patent No.: US 10,854,476 B2
(45) Date of Patent: Dec. 1, 2020

(54) SEMICONDUCTOR VERTICAL WIRE BONDING STRUCTURE AND METHOD

(71) Applicant: SJ Semiconductor (Jiangyin) Corporation, Jiangyin (CN)

(72) Inventors: Han Huang, Jiangyin (CN);
Chengchung Lin, Jiangyin (CN);
Yenheng Chen, Jiangyin (CN);
Chengtar Wu, Jiangyin (CN)

(73) Assignee: SJ Semiconductor (Jiangyin) Corporation, Jiangyin (CN)

( * ) Notice: Subject to any disclaimer, the term of this patent is extended or adjusted under 35 U.S.C. 154(b) by 0 days.

(21) Appl. No.: 16/369,891

(22) Filed: Mar. 29, 2019

(65) Prior Publication Data

US 2020/0043889 A1    Feb. 6, 2020

(51) Int. Cl.
*H01L 21/48* (2006.01)
*H01L 23/00* (2006.01)

(52) U.S. Cl.
CPC ...... *H01L 21/4889* (2013.01); *H01L 21/4825* (2013.01); *H01L 21/4853* (2013.01); *H01L 21/4885* (2013.01); *H01L 24/08* (2013.01); *H01L 24/42* (2013.01); *H01L 24/45* (2013.01); *H01L 24/48* (2013.01); *H01L 24/85* (2013.01)

(58) Field of Classification Search
CPC ......... H01L 23/52; H01L 24/02; H01L 24/03; H01L 24/05; H01L 24/08; H01L 24/42; H01L 24/43; H01L 24/44; H01L 24/45; H01L 24/47; H01L 24/48; H01L 24/85; H01L 24/95; H01L 21/4825; H01L 21/4853; H01L 21/4885; H01L 21/4889
See application file for complete search history.

(56) References Cited

U.S. PATENT DOCUMENTS

| | | | | |
|---|---|---|---|---|
| 3,430,835 A * | 3/1969 | Patzer | ...................... | H01L 24/48 228/4.1 |
| 4,080,485 A * | 3/1978 | Bonkohara | ............... | C22C 5/02 428/620 |
| 4,750,666 A * | 6/1988 | Neugebauer | ......... | B23K 20/007 228/160 |
| 5,058,798 A * | 10/1991 | Yamazaki | ............... | H01L 24/11 228/110.1 |
| 6,169,331 B1 * | 1/2001 | Manning | .................. | H01L 23/52 257/784 |
| 6,727,579 B1 * | 4/2004 | Eldridge | ................... | H05K 3/24 257/692 |
| 9,793,222 B1 * | 10/2017 | Lee | ...................... | H01L 25/0655 |
| 9,812,402 B2 * | 11/2017 | Awujoola | ............ | H01L 25/0655 |
| 10,147,693 B2 * | 12/2018 | Hwang | ................... | H01L 24/11 |

(Continued)

*Primary Examiner* — Eduardo A Rodela
(74) *Attorney, Agent, or Firm* — Alston & Bird LLP

(57) ABSTRACT

The present disclosure provides a semiconductor IC structure having vertical wire bonding and method of making it. The method includes two steps. First step: providing a semiconductor chip, disposing a first solder joint and a second solder joint separately on its surface, disposing a wire bonding pad at the first solder joint, to connect to an internal functioning device of the semiconductor chip, and disposing a dummy pad at the second solder joint. Second step: bonding a metal wire on the wire bonding pad, cutting the metal wire on the dummy pad, and breaking the metal wire by pulling above the wire bonding pad, to obtain a vertical conductive column connected to the wire bonding pad.

14 Claims, 6 Drawing Sheets

(56) References Cited

U.S. PATENT DOCUMENTS

| | | | |
|---|---|---|---|
| 2004/0100296 A1* | 5/2004 | Ong | G01R 31/2884 324/750.3 |
| 2006/0216855 A1* | 9/2006 | Vinn | H01L 23/49575 438/106 |
| 2007/0035019 A1* | 2/2007 | Carney | H01L 23/3121 257/734 |
| 2007/0132086 A1* | 6/2007 | Agraharam | H01L 23/522 257/696 |
| 2009/0273097 A1* | 11/2009 | Hedler | H01L 22/32 257/778 |
| 2010/0181617 A1* | 7/2010 | Lee | H01L 23/544 257/341 |
| 2013/0093087 A1* | 4/2013 | Chau | H01L 24/78 257/738 |
| 2015/0129647 A1* | 5/2015 | Haba | B23K 20/004 228/159 |

\* cited by examiner

SEMICONDUCTOR VERTICAL WIRE BONDING STRUCTURE AND METHOD

CROSS REFERENCES TO RELATED APPLICATIONS

This application claims the benefit of priority to Chinese Patent Application No. CN2018108863252, entitled "Vertical Wire Bonding in Semiconductor Structure and Method of Making It", filed with SIPO on Aug. 6, 2018, and Chinese Patent Application No. CN2018212649473, entitled "Vertical Wire Bonding in Semiconductor Structure", filed with SIPO on Aug. 6, 2018, the contents of which are incorporated herein by reference in its entirety.

TECHNICAL FIELD

The present disclosure relates to the field of semiconductor packaging, and in particular, to vertical wire bonding in a semiconductor structure and method of making it.

BACKGROUND

All computing and communications systems require a power transmission subsystem. A power transfer system converts a high voltage of a power source into many different low voltages required by separate devices in the system. In fan-out packaging, the amplitude of a signal transmission loss depends on a conducting wire connected to all layers in the device to transmit a power signal.

In an existing vertical wire bonding process, wire bonding is performed at a first solder joint, and wire cutting is performed at a second solder joint. Because there is no exclusive pad at the second solder joint, a wire cutting action at the second solder joint is completed at a front layer, i.e., the PI(polyimide)/metal layer, this cutting action might damage the front layer, leaving many pits in the PI/metal. The pits will result in uneven surface, after plastic packaging molding, it is easy to form a wide range of peeling, and an internal structure and electrical performance of a chip will be affected; if the damage is excessively deep, flatness of the front layer will be affected, thereby causing signal interrupt when an electrical signal is transmitted at the layer.

Therefore, it has become an urgent technical problem to eliminate the damage from the second solder joint in a vertical wire bonding in a semiconductor structure. The result should improve flatness of the front layer and a base layer in the vertical wire bonding process. In addition, it may alleviate the risk of generating peeling, improve transmission performance of an electrical signal at each conductive layer in the chip and improve efficiency and precision of the vertical wire bonding process.

SUMMARY

The present disclosure provides vertical wire bonding in a semiconductor method, comprising the following two steps: step S1 comprising: providing a semiconductor chip, disposing a first solder joint and a second solder joint separately on a surface of the semiconductor chip, disposing a wire bonding pad at the first solder joint, wherein the wire bonding pad is connected to an internal functioning device of the semiconductor chip, and disposing a dummy pad at the second solder joint; and step S2 comprising: bonding a metal wire on the wire bonding pad, cutting the metal wire on the dummy pad, and breaking the metal wire by pulling above the wire bonding pad, to obtain a vertical conductive column connected to the wire bonding pad.

Optionally, the step S2 comprises the following sub-steps: S2-1: passing the metal wire through a chopper, leaving a safe distance from a chopper head; S2-2: melting a wire tail of the metal wire into a metal ball; S2-3: lowering the chopper to the first solder joint, and press-welding the metal ball onto a surface of the wire bonding pad; S2-4: lifting the chopper after the press-welding is completed; S2-5: when the chopper is lifted to a height required by wire bonding, closing a wire clamp above the chopper, lowering and moving the chopper to the second solder joint, and thinning the metal wire on a surface of the dummy pad; and S2-6: moving the chopper to a preset height above the first solder joint, keeping the wire clamp closed, and breaking the metal wire at a thinned location by using an upward pulling force of the chopper.

Optionally, in the step S2-5, after thinning the metal wire on the surface of the dummy pad, the chopper further performs oscillation in a horizontal direction.

Optionally, the dummy pad has a thickness ranging from 2 μm to 5 μm.

Optionally, an area of a top surface of the dummy pad is greater than an area of a bottom surface of the chopper.

Optionally, the area of the top surface of the dummy pad is 1.1 to 1.5 times the area of the bottom surface of the chopper.

Optionally, a surface of the semiconductor chip is provided with an insulation layer, and the dummy pad is located on a surface of the insulation layer and is not connected to the internal function device of the semiconductor chip.

Optionally, the vertical conductive column is used for three-dimensional packaging.

The present disclosure further provides vertical wire bonding in a semiconductor structure, comprising: a semiconductor chip, a surface of which is separately disposed a first solder joint and a second solder joint; a wire bonding pad, located on the first solder joint and connected to an internal functioning device of the semiconductor chip; a vertical conductive column, connected to a surface of the wire bonding pad; and a dummy pad, located on the second solder joint and used as a wire cutting platform for forming the vertical conductive column.

Optionally, the dummy pad has a thickness ranging from 2 μm to 5 μm.

Optionally, a top surface of the dummy pad is greater than a bottom surface of the chopper.

Optionally, the top surface of the dummy pad is 1.1 to 1.5 times the bottom surface of the chopper.

Optionally, a surface of the semiconductor chip is provided with an insulation layer, and the dummy pad is located on a surface of the insulation layer and is not connected to the internal function device of the semiconductor chip.

Optionally, the vertical conductive column is used for three-dimensional packaging.

Figure 1:
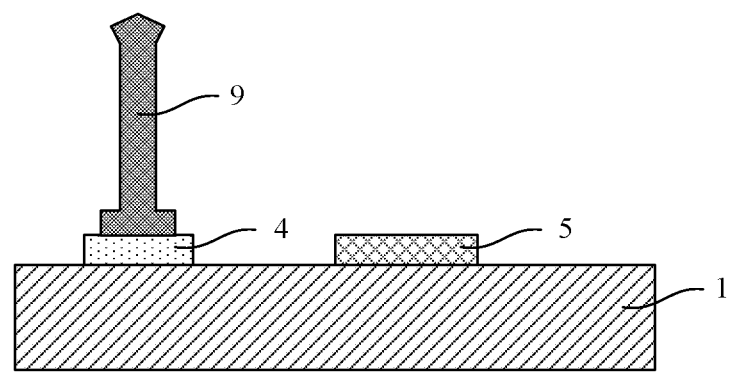
FIG. 1 is a cross sectional view of vertical wire bonding in a semiconductor structure, according to the present disclosure.

| Descriptions of reference numerals | |
|---|---|
| S1 to S2, S2-1 to S2-6 | Steps |
| 1 | Semiconductor chip |
| 2 | First solder joint |
| 3 | Second solder joint |
| 4 | Wire bonding pad |
| 5 | Dummy pad |
| 6 | Metal wire |
| 7 | Chopper |
| 8 | Metal ball |
| 9 | Vertical conductive column |

DETAILED DESCRIPTION OF THE PREFERRED EMBODIMENTS

Implementations according to the present disclosure are illustrated below through particular and specific examples, and a person skilled in the art may easily understand other advantages and efficacy according to the present disclosure through the disclosure of this specification. The present disclosure may further be implemented or applied through additional different specific implementations, various modifications or changes may also be made to details in this specification without departing from the spirit according to the present disclosure based on different viewpoints and applications.

Referring to FIG. 1 to FIG. 10, it should be noted that, the drawings provided the embodiments illustrate the basic idea according to the present disclosure only in a schematic manner, so that the drawings only show components related to the present disclosure which are not drawn according to the number, the shape and the size of the components during practical implementation, the type, the quantity and the proportion of the components during practical implementation may be randomly changed, and a component layout type may also be more complicated.

Embodiment 1

The present disclosure provides vertical wire bonding for a semiconductor IC structure. FIG. 1 is a cross sectional view of the vertical wire bonding structure. The vertical wire bonding structure comprises a semiconductor chip 1, a wire bonding pad 4, a vertical conductive column 9 and a dummy pad 5. A surface of the semiconductor chip 1 has a first solder joint and a second solder joint that are separately disposed, the wire bonding pad 4 is located at the first solder joint and is connected to an internal function device of the semiconductor chip 1, the vertical conductive column 9 is connected to a surface of the wire bonding pad 4, and the dummy pad 5 is located at the second solder joint and is used to provide a wire cutting platform for forming the vertical conductive column 9.

Specifically, the semiconductor chip 1 is a semiconductor device that can implement a function and that is manufactured by performing semiconductor processes such as etching and wiring on a semiconductor sheet. Wire bonding is also referred to as press-welding, binding, bonding, wire welding or the like, and means that a connection between internal interconnected wires of a solid circuit in a microelectronic device, that is, a connection between a chip and a circuit or a lead frame is completed by using a metal wire (a gold wire, an aluminum wire or the like) and by using thermal compression or ultrasonic energy. In the present disclosure, the vertical conductive column 9 is manufactured on the wire bonding pad 4 by using a vertical wire bonding process, and the vertical conductive column 9 is used for subsequent three-dimensional stacking packaging. That is, the semiconductor chip 1 is connected to another package body by using the conductive column 9, to form a three-dimensional stacking package structure.

Specifically, the semiconductor chip 1 may have a plurality of connection points to be led out. Therefore, there may be a plurality of wire bonding pads 4. In the present disclosure, a dummy pad 5 may be independently disposed beside each wire bonding pad on which a vertical conductive column needs to be manufactured, or a dummy pad 5 may be shared by two or more wire bonding pads 4. A distance between the dummy pad 5 and the wire bonding pad 4 depends on the height of a vertical conductive column to be formed, and the distance between the dummy pad 5 and the wire bonding pad 4 needs to be less than the height of the vertical conductive column to be formed.

It should be noted that, "dummy" in the dummy pad does not mean that the pad does not exist, but means that the pad is not connected to the internal function device of the semiconductor chip 1. Actually, the dummy pad 5 is physical. In this embodiment, both the wire bonding pad 4 and the dummy pad 5 are made of a conductive metal material, comprising but being not limited to a material such as aluminum (Al), copper (Cu), or gold (Au).

Specifically, a surface of the semiconductor chip 1 is provided with an insulation layer, and the dummy pad 5 is located on a surface of the insulation layer and is not connected to the internal function device of the semiconductor chip. A material of the insulation layer comprises but is not limited to a material such as silicon dioxide, silicon nitride, or polyimide (PI).

Specifically, the shape of the dummy pad 5 comprises but is not limited to a circle, a square or the like. The dummy pad 5 has a thickness ranging from 2 μm to 5 μm. By disposing the dummy pad 5 and using the thickness of the dummy pad 5, depression caused by the chopper at the second solder joint during wire cutting may be offset, so as to improve flatness of a surface of the semiconductor chip 1 after the vertical wire bonding process, thereby reducing a probability of forming a wide range of peeling after plastic packaging molding.

Specifically, an area of a top surface of the dummy pad 5 is preferably greater than an area of a bottom surface of the chopper, so as to disperse a pressure when the chopper performs wire cutting, thereby reducing a depression at the second solder joint during the wire cutting, eliminating damage due to the second solder joint in vertical wire bonding, improving flatness of a front layer and a base layer of the vertical wire bonding process, and improving transmission performance of an electrical signal of each conductive layer in the chip.

In this embodiment, the area of the top surface of the dummy pad is preferably 1.1 to 1.5 times the area of the bottom surface of the chopper. If an area of the dummy pad is excessively small, the pressure during the wire cutting cannot be dispersed, or if the area is excessively large, an additional capacitance will be introduced, which will interfere internal device of the semiconductor chip.

In the semiconductor vertical wire bonding structure according to the present disclosure, the dummy pad is added to the second solder joint, to eliminate the damage generated because the second solder joint is at the front layer in vertical wire bonding, thereby improving the flatness of the front layer and the base layer in the vertical wire bonding process and alleviating the risk of generating peeling, and improving transmission performance of an electrical signal of each conductive layer in the chip. Moreover, existence of the dummy pad further facilitates improving efficiency and precision of the vertical wire bonding process.

Embodiment 2

Figure 2:
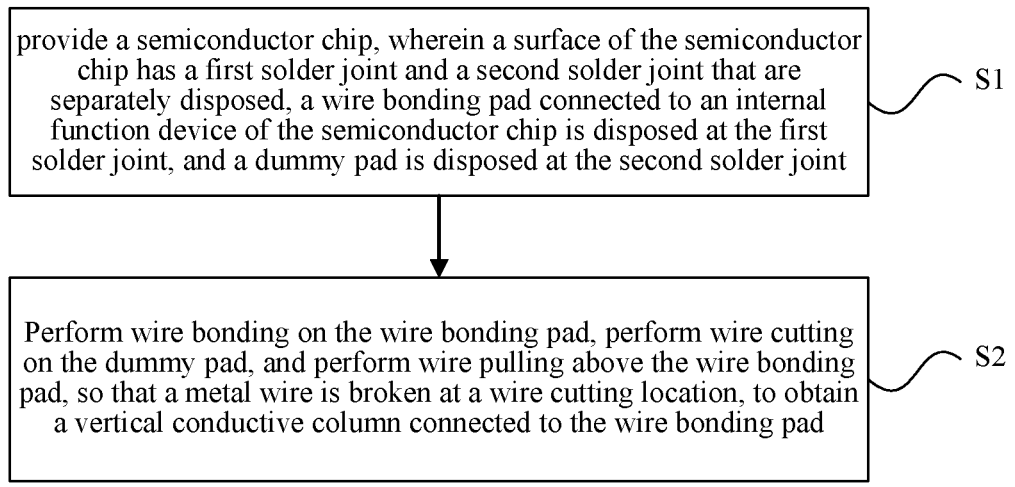
FIG. 2 is a process flowchart of vertical wire bonding method according to the present disclosure.
Figure 3:
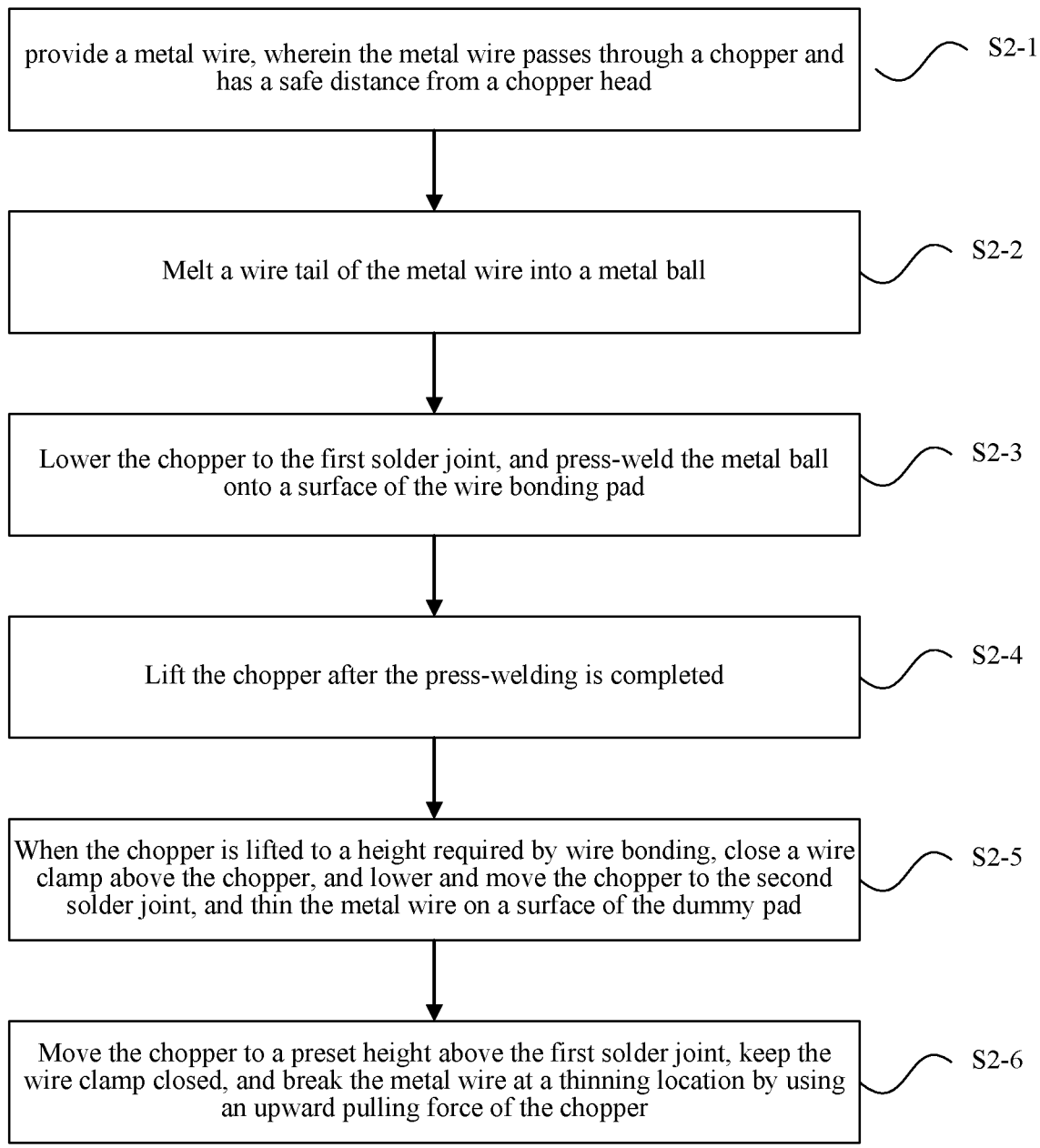
FIG. 3 is a process flowchart of step S2 in vertical wire bonding method of FIG. 2, according to the present disclosure.

The present disclosure further provides vertical wire bonding method. FIG. 2 is a process flowchart of the semiconductor vertical wire bonding method. The method comprises the following steps:

First, step S1 is performed: referring to FIG. 3, providing a semiconductor chip 1, wherein a surface of the semiconductor chip 1 has a first solder joint and a second solder joint that are separately disposed, a wire bonding pad 4 connected to an internal function device of the semiconductor chip 1 is disposed at the first solder joint, and a dummy pad 5 is disposed at the second solder joint.

Specifically, the semiconductor chip 1 is a semiconductor device that can implement a function and that is manufactured by performing semiconductor processes such as etching and wiring on a semiconductor sheet. The semiconductor chip 1 may have a plurality of connection points to be led out. Therefore, there may be a plurality of wire bonding pads 4.

Specifically, a dummy pad 5 may be independently disposed beside each wire bonding pad on which a vertical conductive column needs to be manufactured, or a dummy pad 5 may be shared by two or more wire bonding pads 4. A distance between the dummy pad 5 and the wire bonding pad 4 depends on the height of a vertical conductive column to be formed, and the distance between the dummy pad 5 and the wire bonding pad 4 needs to be less than the height of the vertical conductive column to be formed.

It should be noted that, "dummy" in the dummy pad does not mean that the pad does not exist, but means that the pad is not connected to the internal function device of the semiconductor chip 1. Actually, the dummy pad 5 is physical. In this embodiment, both the wire bonding pad 4 and the dummy pad 5 are made of a conductive metal material, comprising but being not limited to a material such as aluminum (Al), copper (Cu), or gold (Au). The shape of the dummy pad 5 comprises but is not limited to a circle, a square or the like.

Specifically, a surface of the semiconductor chip 1 is provided with an insulation layer, and the dummy pad 5 is located on a surface of the insulation layer and is not connected to the internal function device of the semiconductor chip. A material of the insulation layer comprises but is not limited to a material such as silicon dioxide, silicon nitride, or polyimide (PI).

Then, step S2 is performed: performing wire bonding on the wire bonding pad 4, then performing wire cutting on the dummy pad 5, and performing wire pulling above the wire bonding pad 4, so that a metal wire 6 is broken at a wire cutting location, to obtain a vertical conductive column 9 connected to the wire bonding pad.

Figure 4:
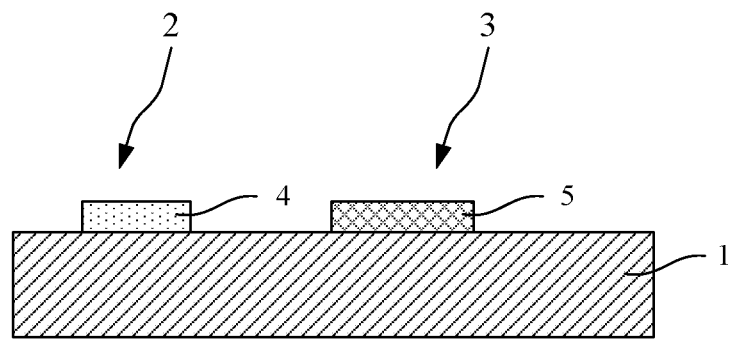
FIG. 4 is a cross sectional view of a semiconductor chip provided with a vertical wire bonding method, according to the present disclosure.
Figure 5:
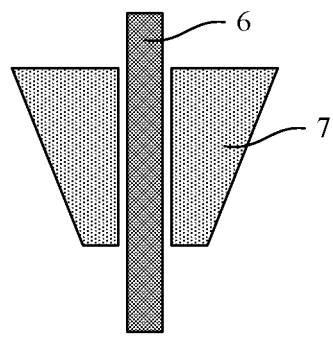
FIG. 5 is a cross sectional view of a metal wire in vertical wire bonding process method, according to the present disclosure, wherein the metal wire passes through a chopper.

In an example, referring to FIG. 4, the step S2 comprises the following sub-steps:

As shown in FIG. 5, step S2-1 is performed: providing a metal wire 6, wherein the metal wire 6 passes through a chopper 7 and has a safe distance from a chopper head.

Specifically, the chopper 7 is used as a welding head of press-welding, wherein the chopper 7 has a via allowing the metal wire to pass through, and a wire clamp (not shown) is disposed above the chopper 7, the wire clamp is used to control the length of the metal wire. This is a conventional technology in the art, the details are not described herein.

Specifically, a material of the metal wire 6 comprises but is not limited to a material such as aluminum (Al), copper (Cu), or gold (Au). The diameter of the metal wire 6 is selected according to the diameter of the vertical conductive column to be prepared.

Figure 6:
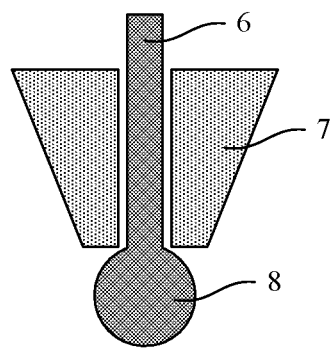
FIG. 6 is a cross sectional view of a metal wire having a melted tail in a vertical wire bonding process, according to the present disclosure.

As shown in FIG. 6, step S2-2 is performed: melting a wire tail of the metal wire 6 into a metal ball 8.

In an example, electronic flame off (EFO) is performed on the wire tail of the metal wire 6, so that the wire tail forms a metal ball.

Figure 7:
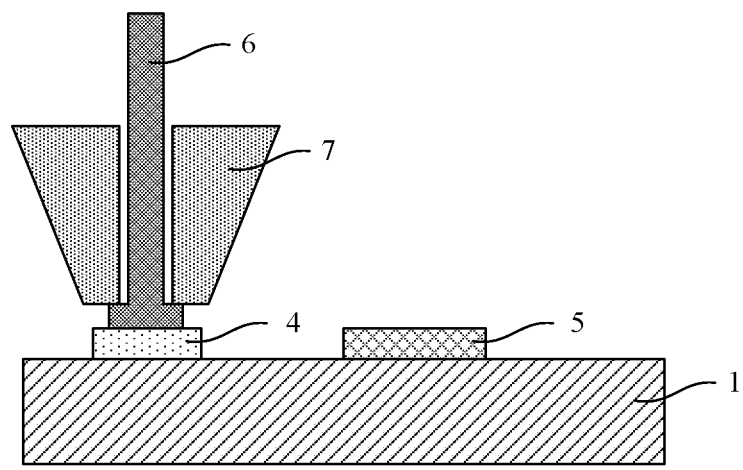
FIG. 7 is a cross sectional view of lowering a chopper to a first solder joint and press-welding a metal ball onto a surface of a wire bonding pad during vertical wire bonding process, according to the present disclosure.

As shown in FIG. 7, step S2-3 is performed: lowering the chopper 7 to the first solder joint, and press welding the metal ball 8 onto a surface of the wire bonding pad 4.

Figure 8:
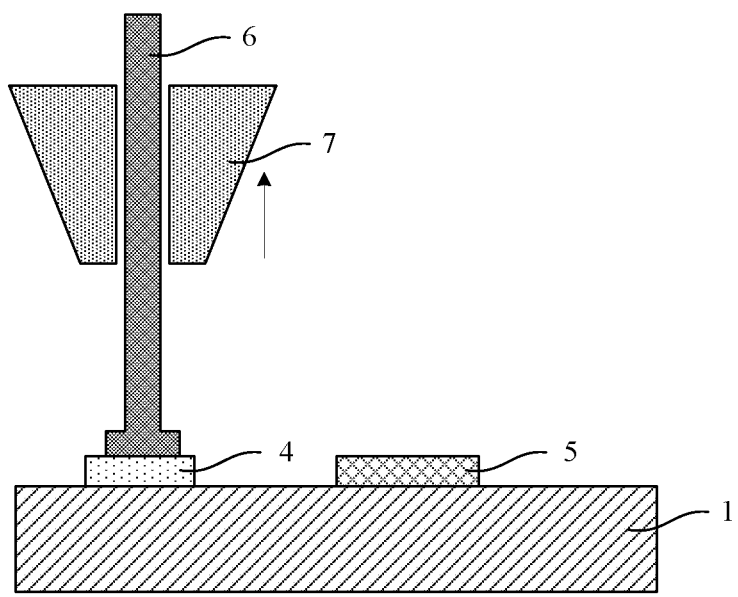
FIG. 8 is a cross sectional view of lifting a chopper after press-welding is completed in the vertical wire bonding process, according to the present disclosure.

As shown in FIG. 8, step S2-4 is performed: lifting the chopper 7 after the press-welding is completed.

Figure 9:
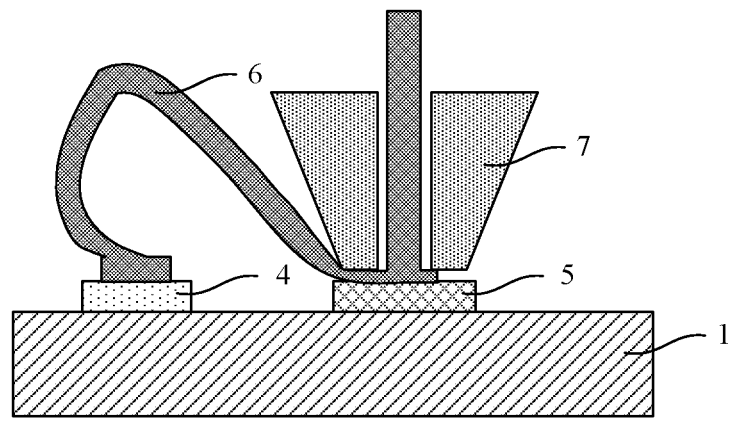
FIG. 9 is a cross sectional view of thinning the metal wire on a surface of a dummy pad during the vertical wire bonding according to the present disclosure.

As shown in FIG. 9, step S2-5 is performed: when the chopper 7 is lifted to a height required by wire bonding, closing a wire clamp above the chopper 7, then lowering and moving the chopper 7 to the second solder joint, and thinning the metal wire 6 on a surface of the dummy pad. A thinning process is referred to as wire cutting.

Specifically, depression caused by the chopper at the second solder joint during wire cutting may be offset by using the thickness of the dummy pad 5, so as to improve flatness of a surface of the semiconductor chip 1 after the vertical wire bonding process, thereby reducing a probability of forming a wide range of peeling after plastic packaging molding.

Specifically, when thinning the metal wire on the surface of the dummy pad, the chopper 7 further performs oscillation in a horizontal direction, such as oscillation in an XY direction simultaneously, to further thin the metal wire, so that the metal wire is broken more easily at a thinning location.

Specifically, an area of a top surface of the dummy pad 5 is preferably greater than an area of a bottom surface of the chopper 7, so as to disperse a pressure when the chopper performs wire cutting, thereby reducing a depression at the second solder joint during the wire cutting, eliminating damage generated because of the second solder joint in vertical wire bonding, improving flatness of a front layer and a base layer of the vertical wire bonding process, and improving transmission performance of an electrical signal of each conductive layer in the chip.

In this embodiment, the area of the top surface of the dummy pad is preferably 1.1 to 1.5 times the area of the bottom surface of the chopper. If an area of the dummy pad is excessively small, the pressure during the wire cutting cannot be dispersed, or if the area is excessively large, a parasitic capacitance will be introduced, which will interfere internal device of the semiconductor chip.

Figure 10:
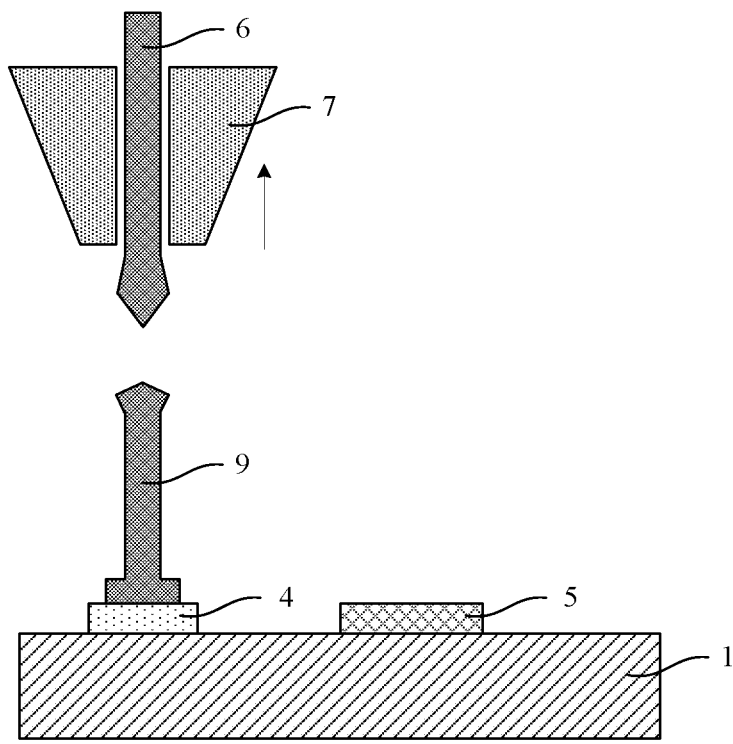
FIG. 10 is a cross sectional view of pulling the chopper upward to break the metal wire from the thinned point during the vertical wire bonding process, according to the present disclosure.

As shown in FIG. 10, step S2-6 is performed: moving the chopper 7 to a preset height above the first solder joint, keeping the wire clamp closed, and breaking the metal wire at a thinning location by using an upward pulling force of the chopper.

So far, the vertical conductive column 9 is manufactured on the wire bonding pad 4 at the first solder joint by using the vertical wire bonding process. The vertical conductive column 9 is used for subsequent three-dimensional stacking packaging. That is, the semiconductor chip 1 is connected to other package body by using the conductive column 9, to form a three-dimensional stacking package structure.

To sum up, in the semiconductor vertical wire bonding structure and method according to the present disclosure, the dummy pad is added to the second solder joint, to eliminate the damage generated because the second solder joint is at the front layer in vertical wire bonding, thereby improving the flatness of the front layer and the base layer in the vertical wire bonding process and alleviating the risk of generating peeling, improving transmission performance of an electrical signal of each conductive layer in the chip, and facilitating improving efficiency and precision of the vertical wire bonding process. Therefore, the present disclosure effectively overcomes various disadvantages in the prior art and has a high industrial utilization value.

The foregoing embodiments are merely intended to exemplarily describe the principles and efficacy according to the present disclosure and are not intended to limit the present disclosure. A person skilled in the art can make modifications or changes to the foregoing embodiments without departing from the spirit and scope according to the present disclosure. Therefore, any equivalent modifications or changes completed by a person of common knowledge in the art without departing from the spirit and technical thoughts disclosed in the present disclosure shall still fall within the scope of the claims according to the present disclosure.

What is claimed is:

1. A vertical wire bonding method for a semiconductor IC, comprising the following two steps:
   step S1 comprising:
   providing a semiconductor chip, disposing a first solder joint and a second solder joint separately on a surface of the semiconductor chip, disposing a wire bonding pad at the first solder joint, wherein the wire bonding pad is connected to an internal functioning device of the semiconductor chip, and disposing a dummy pad at the second solder joint; and
   step S2 comprising:
   bonding a metal wire on the wire bonding pad, cutting the metal wire on the dummy pad, and breaking the metal wire by pulling above the wire bonding pad, to obtain a vertical conductive column connected to the wire bonding pad.

2. The vertical wire bonding method according to claim 1, wherein the step S2 comprises the following sub-steps:
   S2-1: passing the metal wire through a chopper, leaving a safe distance from a chopper head;
   S2-2: melting a wire tail of the metal wire into a metal ball;
   S2-3: lowering the chopper to the first solder joint, and press-welding the metal ball onto a surface of the wire bonding pad;
   S2-4: lifting the chopper after the press-welding is completed;
   S2-5: when the chopper is lifted to a height required by wire bonding, closing a wire clamp above the chopper, lowering and moving the chopper to the second solder joint, and thinning the metal wire on a surface of the dummy pad; and
   S2-6: moving the chopper to a preset height above the first solder joint, keeping the wire clamp closed, and breaking the metal wire at a thinned location by using an upward pulling force of the chopper.

3. The vertical wire bonding method according to claim 2, wherein in the step S2-5, after thinning the metal wire on the surface of the dummy pad, the chopper further performs oscillation in a horizontal direction.

4. The vertical wire bonding method according to claim 1, wherein the dummy pad has a thickness ranging from 2 μm to 5 μm.

5. The vertical wire bonding method according to claim 1, wherein an area of a top surface of the dummy pad is greater than an area of a bottom surface of the chopper.

6. The vertical wire bonding method according to claim 5, wherein the area of the top surface of the dummy pad is 1.1 to 1.5 times of the area of the bottom surface of the chopper.

7. The vertical wire bonding method according to claim 1, wherein a surface of the semiconductor chip is provided with an insulation layer, and the dummy pad is located on a surface of the insulation layer and is not connected to the internal functioning device of the semiconductor chip.

8. The vertical wire bonding method according to claim 1, wherein the vertical conductive column is used for three-dimensional packaging.

9. A semiconductor IC structure made by the vertical wire bonding method according to claim 1.

10. The semiconductor IC structure according to claim 9, wherein the dummy pad has a thickness ranging from 2 μm to 5 μm.

11. The semiconductor IC structure according to claim 9, wherein a top surface of the dummy pad is greater than a bottom surface of the chopper.

12. The semiconductor IC structure according to claim 9, wherein the top surface of the dummy pad is 1.1 to 1.5 times of the bottom surface of the chopper.

13. The semiconductor IC structure according to claim 9, wherein a surface of the semiconductor chip is provided with an insulation layer, and the dummy pad is located on a surface of the insulation layer and is not connected to the internal functioning device of the semiconductor chip.

14. The semiconductor IC structure according to claim 9, wherein the vertical conductive column connects the semiconductor chip to a three-dimensional packaging device.

* * * * *